(12) United States Patent
Cho

(10) Patent No.: US 7,700,451 B2
(45) Date of Patent: Apr. 20, 2010

(54) METHOD OF MANUFACTURING A TRANSISTOR

(75) Inventor: Pyoung On Cho, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 201 days.

(21) Appl. No.: 11/616,817

(22) Filed: Dec. 27, 2006

(65) Prior Publication Data

US 2007/0148842 A1 Jun. 28, 2007

(30) Foreign Application Priority Data

Dec. 28, 2005 (KR) ...................... 10-2005-0131522

(51) Int. Cl.
*H01L 21/336* (2006.01)

(52) U.S. Cl. ...................... 438/305; 438/586; 438/592; 438/664; 257/E21.199; 257/E21.435; 257/E21.438

(58) Field of Classification Search ............... 257/303, 257/305, 586, 592, 664, E21.199, E21.435, 257/E21.438; 438/382, 384, 387–388, 408
See application file for complete search history.

(56) References Cited

U.S. PATENT DOCUMENTS

| 5,028,554 | A | * | 7/1991 | Kita | 438/305 |
| 5,744,395 | A | * | 4/1998 | Shue et al. | 438/305 |
| 5,897,365 | A | * | 4/1999 | Matsubara | 438/592 |
| 5,989,988 | A | * | 11/1999 | Iinuma et al. | 438/592 |
| 6,063,681 | A | * | 5/2000 | Son | 438/303 |
| 6,084,280 | A | * | 7/2000 | Gardner et al. | 257/412 |
| 6,642,119 | B1 | * | 11/2003 | Pelella et al. | 438/303 |

FOREIGN PATENT DOCUMENTS

KR 10-1999-002879 11/1999

* cited by examiner

*Primary Examiner*—M. Wilczewski
*Assistant Examiner*—Toniae M Thomas
(74) *Attorney, Agent, or Firm*—Sherr & Vaughn, PLLC

(57) ABSTRACT

Embodiments relate to a method of manufacturing a transistor having a metal silicide layer. In embodiments, the method may include sequentially forming a gate insulating layer pattern and a gate conductive layer pattern on a semiconductor substrate, forming a first metal silicide layer on the gate conductive layer pattern and a second metal silicide layer on the semiconductor substrate, forming a spacer layer on sidewalls of the gate insulating layer pattern and the gate conductive layer pattern, and forming a source/drain region in the semiconductor substrate below the second metal silicide layer by performing ion implantation.

10 Claims, 8 Drawing Sheets

METHOD OF MANUFACTURING A TRANSISTOR

The present application claims priority under 35 U.S.C. 119 and 35 U.S.C. 365 to Korean Patent Application No. 10-2005-0131522 (filed on Dec. 28, 2005), which is hereby incorporated by reference in its entirety.

BACKGROUND

As semiconductor devices become more highly integrated, a width of a gate pattern within the semiconductor device may be gradually narrowed. However, such a reduction in a width of the gate pattern may increase a resistance of the gate pattern. This may degrade high-speed operation of a transistor. To ameliorate such problems, a method of forming a metal silicide layer having superior conductivity on a gate pattern or a doped region such as a source/drain region has been used.

FIGS. 1 through 3 are example cross-sectional diagrams illustrating a related art method of manufacturing a transistor having a metal silicide layer. FIGS. 4 and 5 are example cross-sectional diagrams illustrating problems that may be caused in the related art method of manufacturing a transistor having a metal silicide layer.

Referring to FIG. 1, gate insulating layer pattern 110 and gate conductive layer pattern 120 may be sequentially stacked on semiconductor substrate 100. Gate conductive layer pattern 120 may include a polysilicon layer. A first ion implantation process may then be performed to form source/drain extension region 131. After that, spacer layer 140 may be formed on the side-walls of gate insulating layer pattern 110 and gate conductive layer pattern 120. A second ion implantation process may be performed to form deep source/drain region 132. Source/drain extension region 131 and deep source/drain region 132 constitute source/drain region 130 of an LDD (Lightly Doped Drain) structure.

Referring to FIG. 2, metal layer 150 may be deposited on a surface (for example, the entire surface) of semiconductor substrate 100. Metal layer 150 may be a titanium (Ti) layer or a cobalt (Co) layer, and may be formed on the surface of semiconductor substrate 100 by a sputtering method.

Referring to FIG. 3, metal layer 150 adjacent to source/drain region 130 of the LDD structure and gate conductive layer pattern 120 may be heat treated. Metal layer 150 may thereby become silicide. As a result, first metal silicide layer 151 and second silicide layer 152 may be formed on gate conductive layer pattern 120 and source/drain region 130 of the LDD structure, respectively. After that, metal layer 150 that is not subject to the reaction may be removed.

Referring to FIG. 4, a spacer insulating layer, e.g., a nitride layer, may not be completely removed, but may remain on source/drain region 130 when forming the metal layer 140. In this case, as indicated by "A" in FIG. 4, the remaining insulating layer may interrupt the formation of second metal silicide layer 152 on source/drain region 130 during the process of forming the metal silicide layer.

Referring to FIG. 5, since non-reacted metal layer 150 may not be completely removed, metal layer residue 150' may remain on a side surface of spacer layer 140. In this case, as indicated by "B" in FIG. 5, a bridge may be generated between first metal silicide layer 151 and second metal silicide layer 152, which may cause a malfunction of the transistor.

SUMMARY

Embodiments relate to a method of manufacturing a transistor. Embodiments relate to a method of manufacturing a transistor having a metal silicide layer.

Embodiments relate to a method of manufacturing a transistor having a metal silicide layer to prevent a formation failure of a metal silicide layer or an occurrence of a bridge phenomenon.

In the embodiments, a method of manufacturing a transistor having a metal silicide layer may include sequentially forming a gate insulating layer pattern and a gate conductive layer pattern on a semiconductor substrate; forming a first metal silicide layer on the gate conductive layer pattern and a second metal silicide layer on the semiconductor substrate; forming a spacer layer on the side-walls of the gate insulating layer pattern and the gate conductive layer pattern; and forming a source/drain region inside semiconductor substrate and below the second metal silicide layer by performing ion implantation.

In embodiments, the method may include forming a source/drain extension region so as to form a source/drain region of a LDD structure by performing low density-ion implantation before forming the spacer layer and after forming the first metal silicide layer and the second metal silicide layer.

The gate conductive layer pattern may include a polysilicon layer.

DETAILED DESCRIPTION OF EMBODIMENTS

Figure 1:
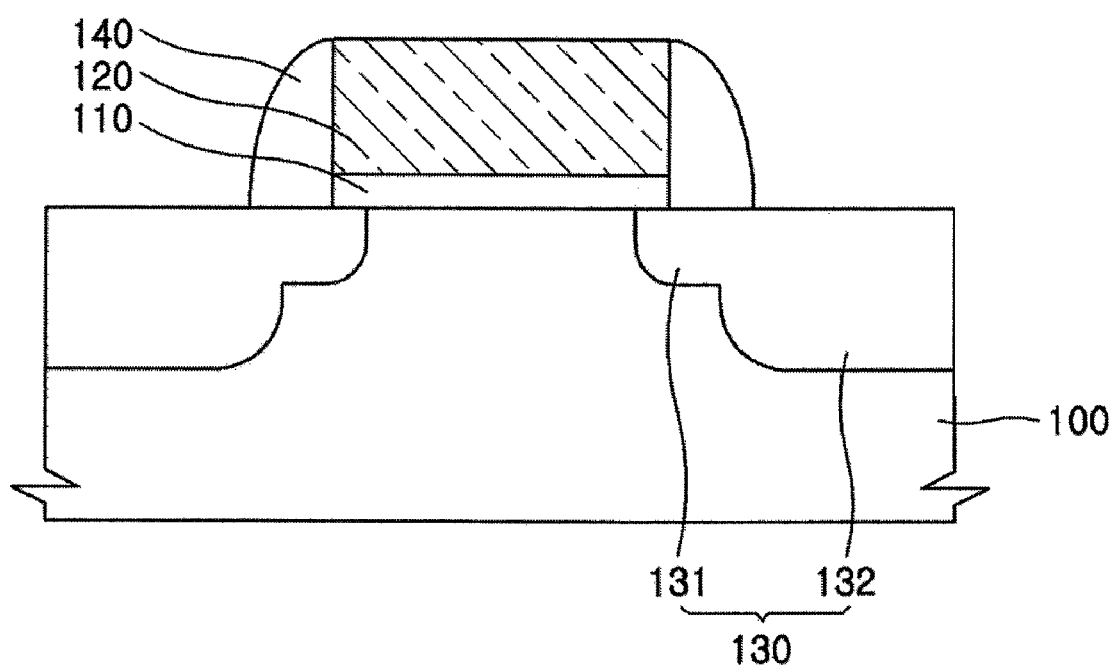
FIGS. 1 through 3 are example cross-sectional diagrams illustrating a related Art method of manufacturing a transistor having a metal silicide layer.
Figure 2:
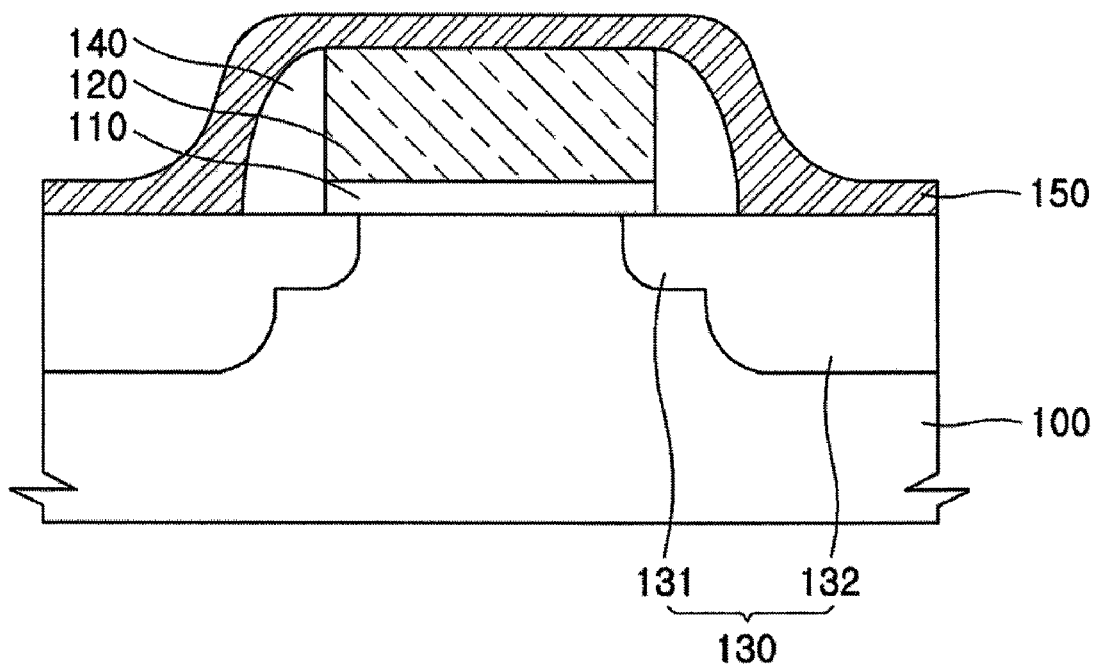
Figure 3:
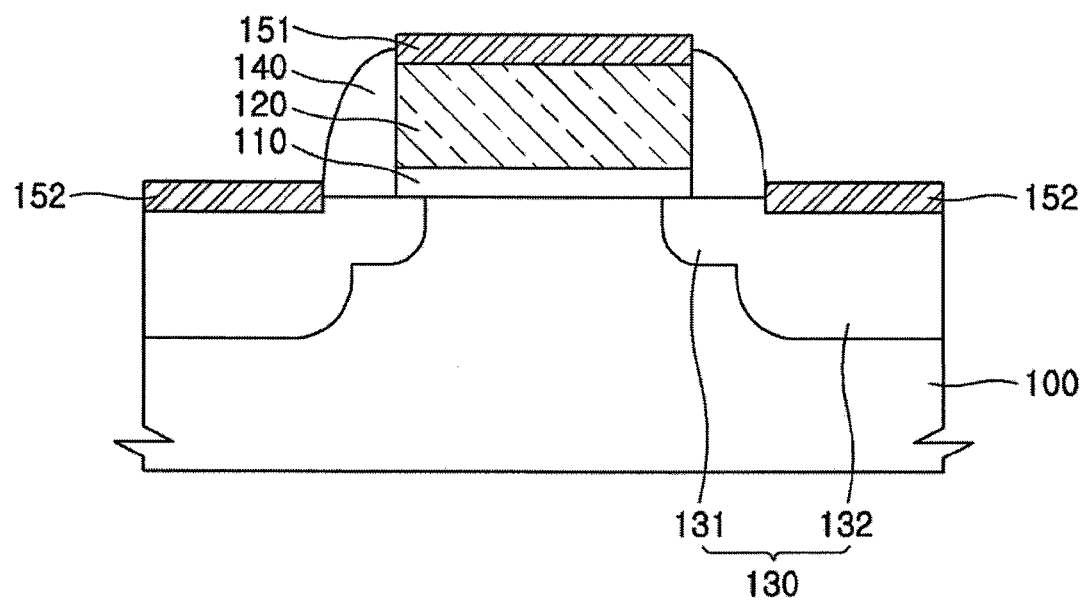
Figure 4:
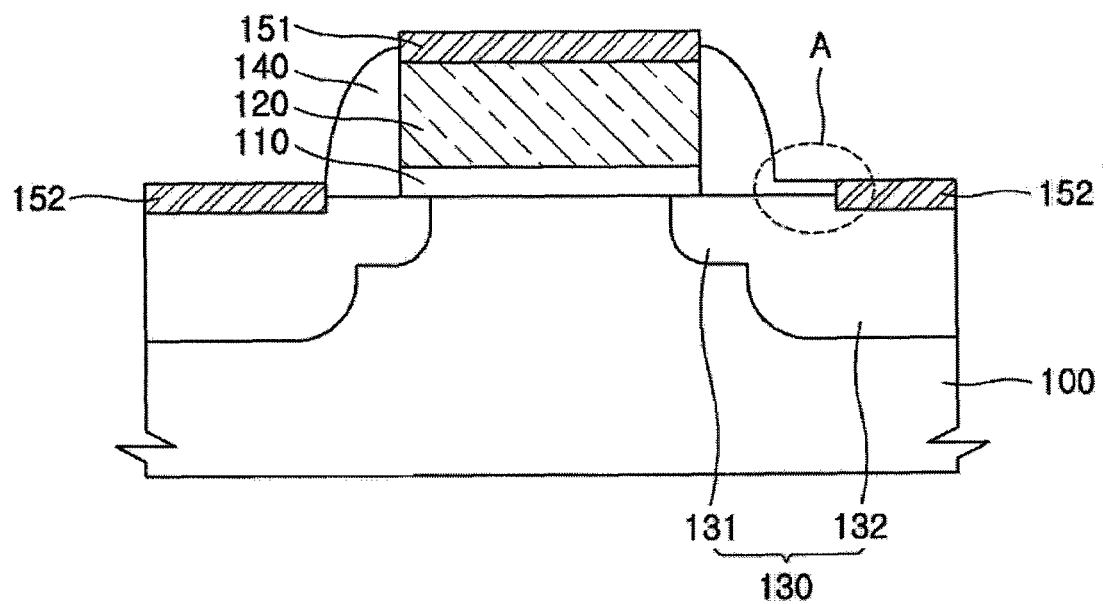
FIGS. 4 and 5 are example cross-sectional views illustrating problems that may be caused in the related art method of manufacturing a transistor having a metal silicide layer.
Figure 5:
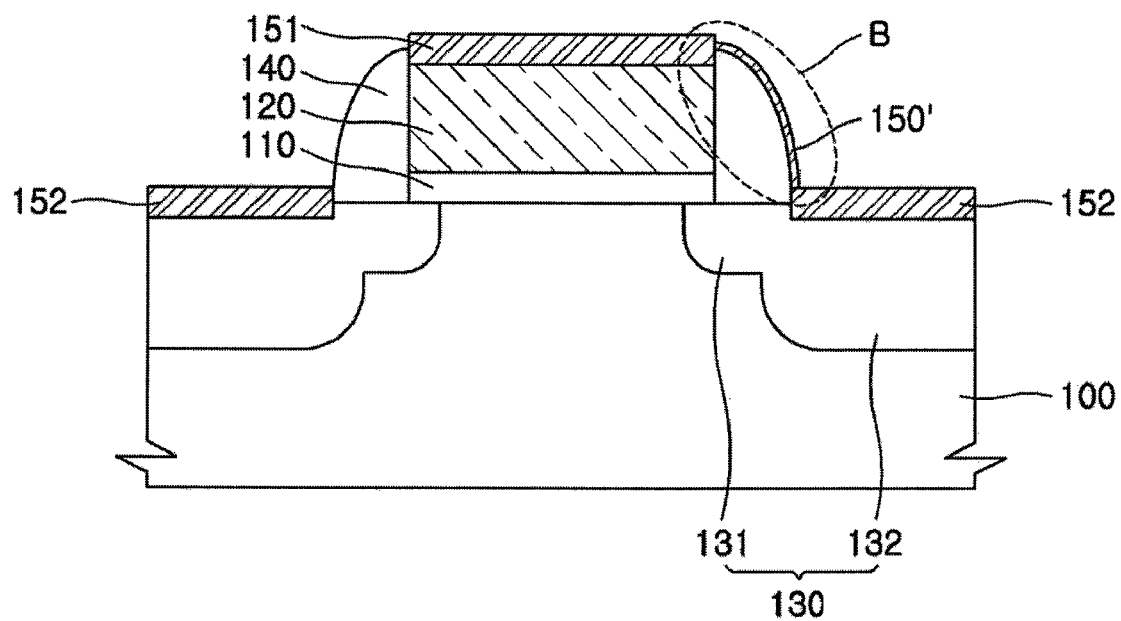
Figure 6:
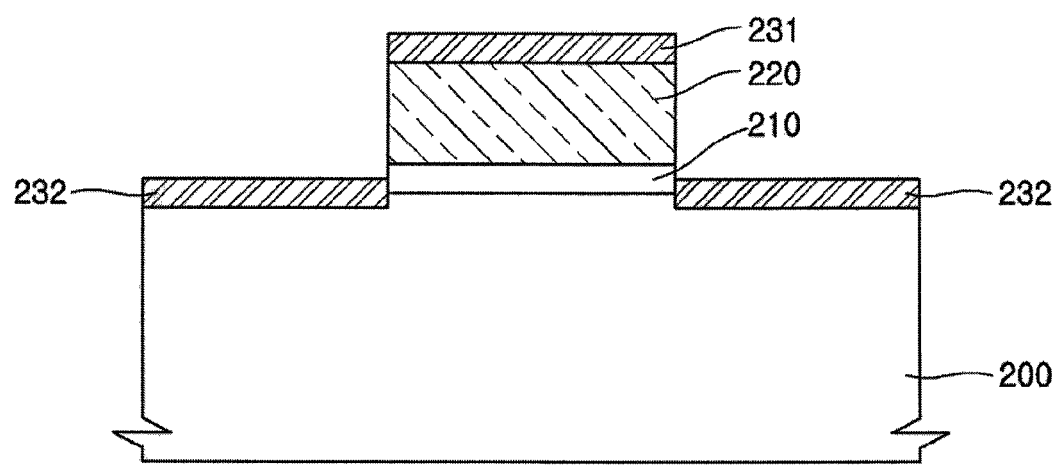
FIGS. 6 through 8 are example cross-sectional diagrams illustrating a method of manufacturing a transistor having a typical metal silicide layer in accordance with embodiments.

Referring to FIG. 6, gate insulating layer 210 and gate conductive layer 220 may be sequentially formed on semiconductor substrate 200. In embodiments, gate insulating layer 210 may be formed on semiconductor substrate 200, and gate conductive layer 220 may be formed on gate insulating layer 210. Exposed portions of a gate conductive layer and a gate insulating layer may be sequentially removed by an etching process, for example using a photoresist layer pattern or a hard mask layer pattern. In embodiments, the gate insulating layer may be formed from a silicon dioxide layer and the gate conductive layer may be formed from a polysilicon layer. First metal silicide layer 231 and second metal silicide layer 232 may then be formed on gate conductive layer 220 and semiconductor substrate 200, respectively. In embodiments, second metal silicide layer 232 may be formed on a specified region of semiconductor substrate 200, on which a source/drain region may be formed by a subsequent process.

Figure 7:
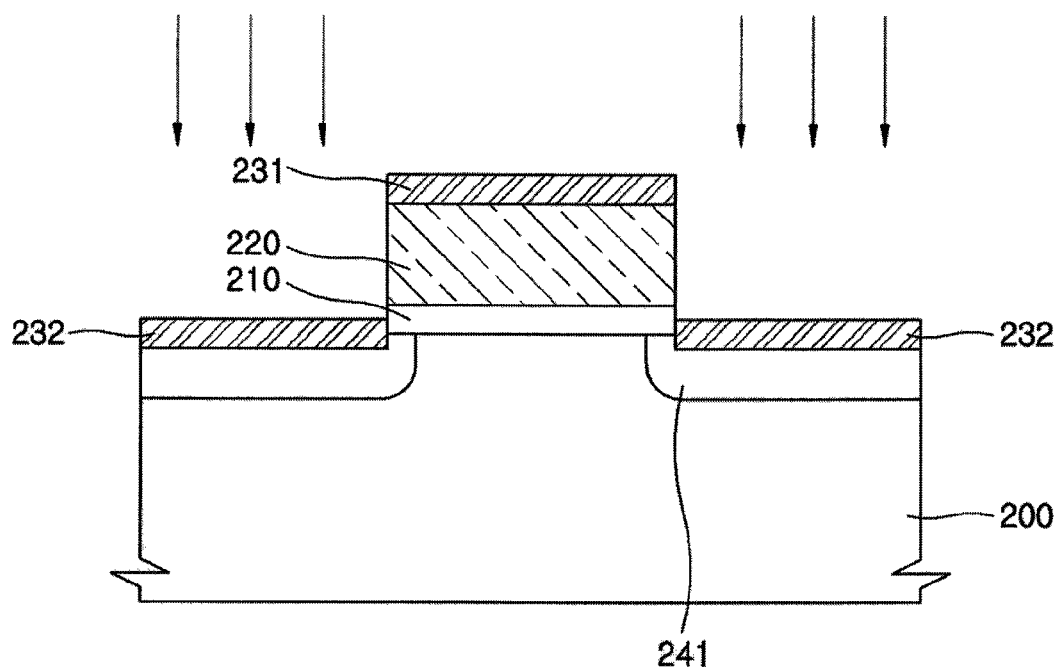

Referring to FIG. 7, source/drain region 241 may be formed by performing low density-ion implantation in the direction of the arrow as shown. Source/drain region 241 and a deep source/drain region formed by a subsequent process may constitute the source/drain region of the LDD structure.

Figure 8:
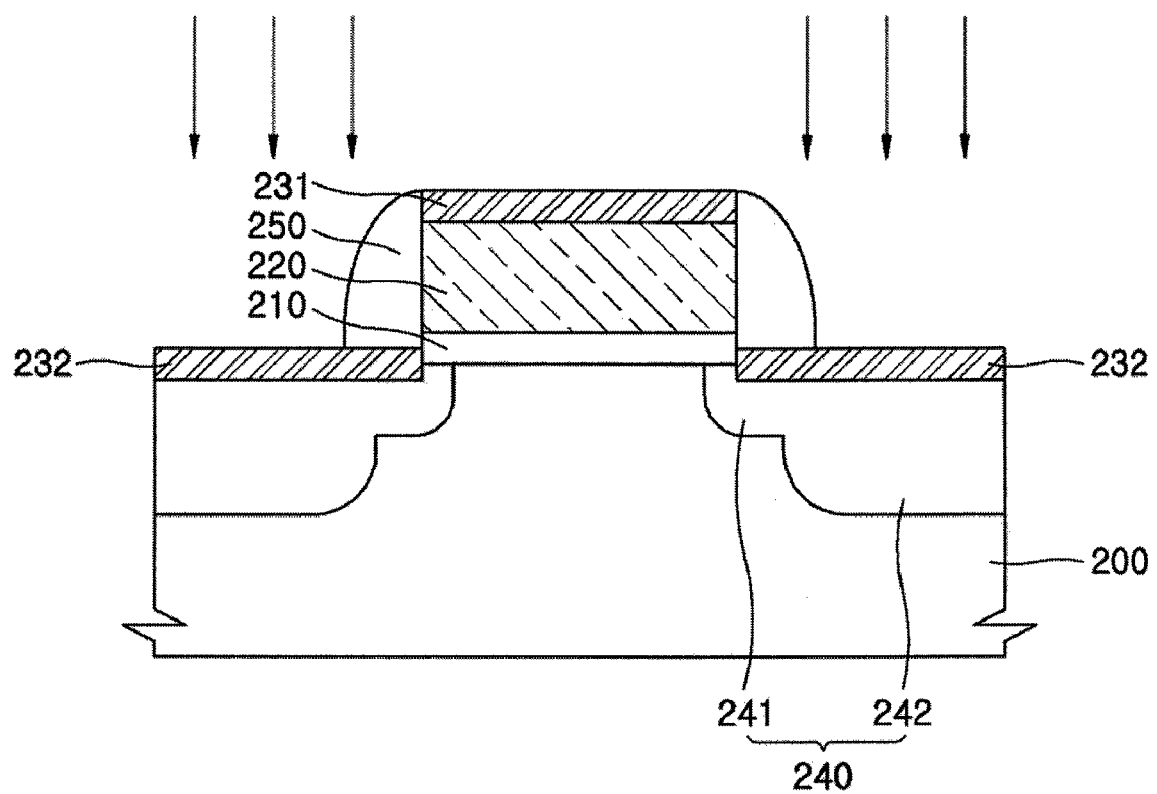

As shown in FIG. 8, spacer layer 250 may be formed on the sidewall of gate conductive layer 220. In embodiments, spacer layer 250 may be formed using a nitride layer. To form spacer layer 250, a spacer material layer, e.g., a nitride layer may be deposited on a wafer surface, for example the entire surface. Next, anisotropic etching, such as an etch-back, may be performed. This may allow first metal silicide layer 231 and second metal silicide layer 232 to be exposed to the outside. Since first metal silicide layer 231 and second metal silicide layer 232 have been already formed prior to the formation of spacer layer 250, the nitride layer may remain on semiconductor substrate 200 upon the formation of spacer layer 250. Hence, the metal silicide layer may be partially formed and the bridge phenomenon may not occur due to the residue of the metal layer on spacer layer 250.

High density-ion implantation may be carried out after the formation of spacer layer 250. Spacer layer 250 may act as a barrier during ion implantation. Deep source/drain region 242 may thus be formed on semiconductor substrate 200 and below second metal silicide layer 232. In embodiments, low density-source/drain extension region 241 and high density-deep source/drain region 242 may constitute source/drain region 240 of the LDD structure. Although not illustrated in figures, a metal wiring layer may subsequently be formed in such a manner as to pass through an insulating layer after the insulating layer may be formed over a surface of the substrate. The transistor having the metal silicide layer may thus be formed.

According to embodiments, a spacer layer may be formed on the sidewall of the gate conductive layer pattern after the first metal silicide layer and the second metal silicide layer are respectively formed on the gate conductive layer pattern and the semiconductor substrate. This may prevent a formation failure of the metal silicide layer or an occurrence of a bridge phenomenon, which may otherwise occur when forming the spacer layer.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method comprising:
   forming a gate electrode over a semiconductor substrate;
   forming a first metal silicide layer over the gate electrode and a second metal silicide layer over the semiconductor substrate;
   forming a source/drain region in the semiconductor substrate below the second metal silicide layer by performing ion implantation;
   forming a source/drain extension region to form a source/drain region having an LDD structure;
   forming a spacer layer on and directly contacting sidewalls of the gate electrode, on and directly contacting sidewalls of the first metal silicide layer and over a portion of the second silicide layer,
   wherein forming the source/drain region comprises performing low-density ion implantation before forming the spacer layer and after forming the first and second metal silicide layers.

2. The method of claim 1, wherein forming the gate electrode comprises forming a gate insulating layer pattern over the semiconductor substrate and a gate conductive layer pattern over the gate insulating layer pattern.

3. The method of claim 2, wherein the gate conductive layer pattern comprises a polysilicon layer.

4. The method of claim 1, wherein the second metal silicide layer is formed over the semiconductor substrate adjacent to both sides of the gate electrode.

5. The method of claim 1, further comprising performing high density ion implantation after forming the spacer layer.

6. The method of claim 1, wherein forming the first and second metal silicide layers comprises forming a first metal layer over the gate electrode and substrate, respectively, and subjecting the first metal layer to a heat treatment.

7. The method of claim 1, where in forming the spacer layer comprises forming a nitride layer over the second metal silicide layer and on sidewalls of the gate electrode.

8. The method of claim 7, wherein the spacer layer is formed over at least a portion of the sides of the first metal silicide layer.

9. A method, comprising:
   forming a gate oxide layer on a semiconductor substrate;
   forming a gate conductive layer over the gate oxide layer;
   forming a first metal silicide layer over the gate conductive layer and a second metal silicide layer over the semiconductor substrate adjacent to the gate oxide layer;
   performing low-density ion implantation to form source/drain regions at either side of the gate oxide layer after forming the first and second metal silicide layers;
   forming a spacer insulating layer on and directly contacting sidewalls of the gate oxide layer, sidewalls of the first metal silicide layer and sidewalls of the gate conductive layer, the spacer insulating layer being formed over at least a portion of the second metal silicide layer; and
   performing high density ion implantation after forming the spacer insulating layer to form a deep source/drain region in at least a portion of the source/drain region.

10. The method of claim 9, wherein the spacer insulating layer is composed of a nitride material.

* * * * *